United States Patent

Matsuo et al.

[11] Patent Number: 4,535,305
[45] Date of Patent: Aug. 13, 1985

[54] TRANSMISSION GATE RELAXATION OSCILLATOR HAVING COMPARATOR

[75] Inventors: Kenji Matsuo; Akira Yamaguchi, both of Yokohama, Japan

[73] Assignee: Tokyo Shibaura Denki Kabushiki Kaisha, Japan

[21] Appl. No.: 402,223

[22] Filed: Jul. 27, 1982

[30] Foreign Application Priority Data

Jul. 30, 1981 [JP] Japan .............................. 56-119766
Jul. 30, 1981 [JP] Japan .............................. 56-119767

[51] Int. Cl.³ .............................................. H03K 3/26
[52] U.S. Cl. ..................................... 331/111; 331/143;
331/153; 331/173; 331/DIG. 3; 328/66; 328/261
[58] Field of Search ............... 331/111, 143, 153, 172, 331/173, DIG. 3; 328/66, 261

[56] References Cited

U.S. PATENT DOCUMENTS

| | | | |
|---|---|---|---|
| 2,121,117 | 6/1938 | Conover | 328/266 |
| 4,301,427 | 11/1981 | Suzuki et al. | 331/111 |
| 4,359,649 | 11/1982 | Mundel | 331/111 |
| 4,365,212 | 12/1982 | Gentile et al. | 331/111 |
| 4,479,097 | 10/1984 | Larson et al. | 331/111 |

OTHER PUBLICATIONS

Adams, B. C. "Novel VCO" *New Electronics*, vol. 10, No. 4, p. 50, Feb. 22, 1977.
J. Graeme & G. Tobey, Operational Amplifiers, Ch. 10 at 370-396, (1971).

Primary Examiner—Eugene R. LaRoche
Assistant Examiner—D. C. Mis
Attorney, Agent, or Firm—Finnegan, Henderson, Farabow, Garrett & Dunner

[57] ABSTRACT

An oscillation circuit having a reference voltage circuit for forming a reference voltage by dividing a power supply voltage. The reference voltage circuit supplies the reference voltage to one of the input terminals of the comparing circuit. A charge/discharge voltage is supplied from a junction between a transmission gate circuit and a CR circuit to the other input terminal of the comparing circuit. The comparing circuit compares the charge/discharge voltage with the reference voltage to produce pulse signals.

17 Claims, 19 Drawing Figures

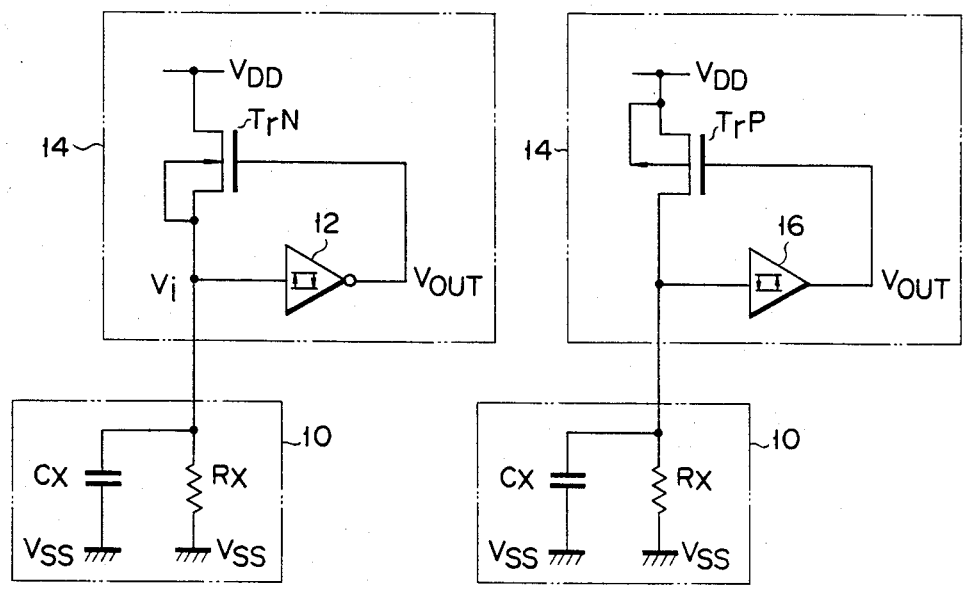
FIG. 1 (PRIOR ART)
FIG. 2 (PRIOR ART)
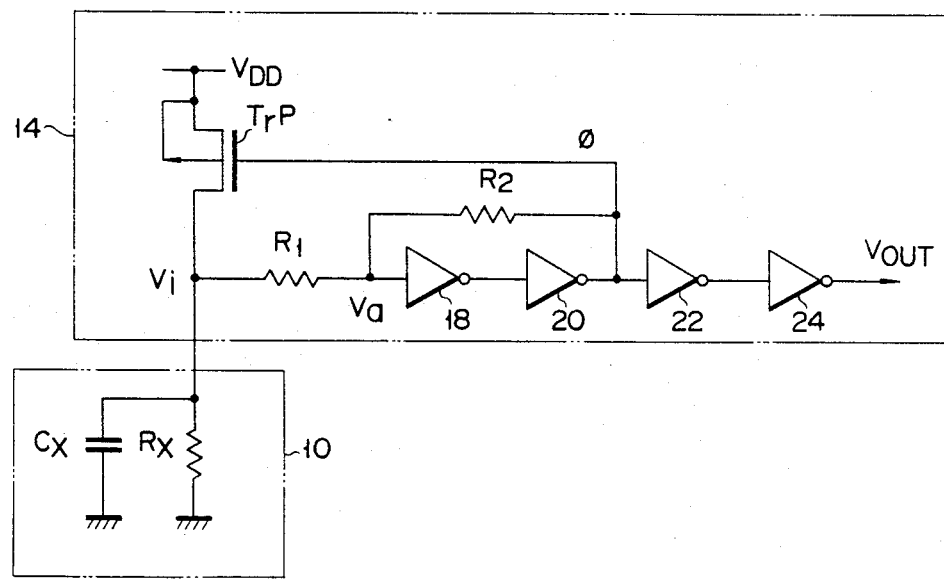
FIG. 3 (PRIOR ART)

F I G. 19
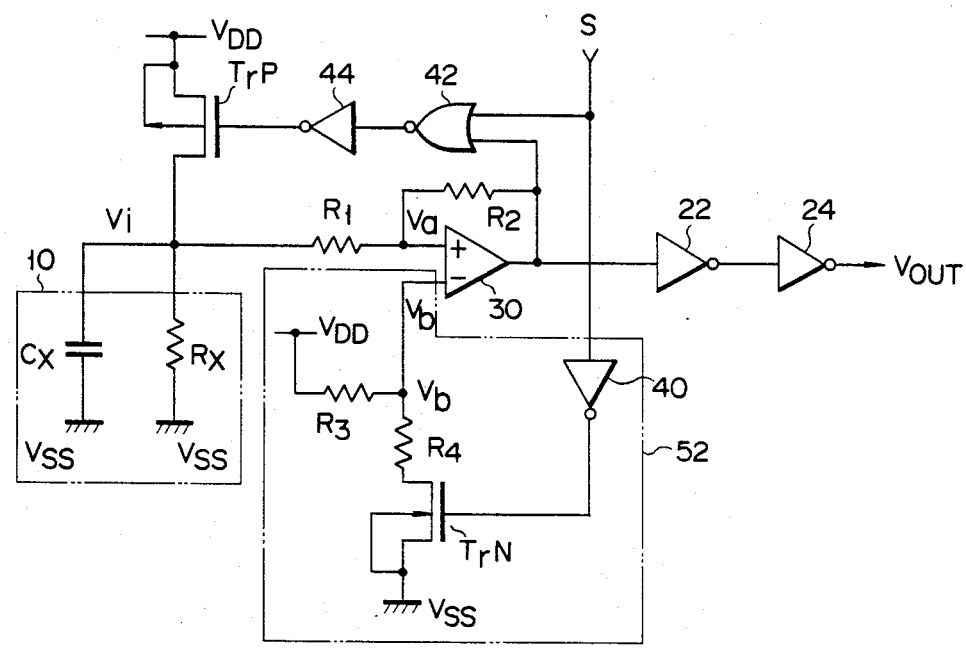

4,535,305

1

TRANSMISSION GATE RELAXATION OSCILLATOR HAVING COMPARATOR

BACKGROUND OF THE INVENTION

The present invention relates to an oscillation circuit and more particularly to an oscillation circuit with an improved oscillation frequency characteristic.

A pulse generating circuit is one of the most important circuits in electronic circuitry, and is used, for example, as a circuit drive source. Of the pulse generating circuits proposed, a CR oscillation circuit, which is simple in construction and allows high density integration, has dominantly been used. The CR oscillator (referred to as an oscillation circuit for brevity) generates a pulse signal at a frequency according to the time constant of the capacitor and the resistor contained in the circuit. FIG. 1 shows a prior oscillation circuit. In the figure, the oscillation circuit has a power transmission gate circuit TrN (referred to as a transmission gate circuit) connected between the power source ($V_{DD}$-$V_{SS}$). The transmission gate circuit is formed of an N-channel MOS transistor, for example. The power source is supplied through the transmission gate circuit TrN to a parallel CR circuit 10 including a capacitor Cx and a resistor Rx. The voltage Vi generated according to the time constant of the capacitor Cx and the resistor Rx in the CR circuit 10 is supplied to a Schmitt trigger gate circuit 12. The gate circuit 12 produces a pulse output signal Vout at a predetermined frequency on the basis of the voltage Vi. The pulse output signal Vout is transferred to the gate of the transfer gate circuit TrN. When such an oscillation circuit is fabricated into an integrated circuit, the CR circuit 10 is externally attached to a single pad in an IC circuit 14.

In such an oscillation circuit, if the voltage Vi is equal to the voltage $V_{SS}$ ("0" level), the output voltage Vout of the gate circuit 12 is equal to the power source voltage $V_{DD}$ ("1" level) and then the transmission gate circuit TrN is turned on, that is, conductive. Accordingly, the power source voltage $V_{DD}$ is supplied to the CR circuit 10, so that the voltage Vi rises to "1" ($V_{IH}$) level. The rise time of the voltage Vi is substantially proportional to the time constant of an onstate resistor of the transistor TrN and the capacitor Cx. While the voltage Vi is rising, at the instant that the voltage Vi exceeds the high level threshold voltage $V_{IH}$ in the Schmidt gate circuit 12, the output voltage Vout of the gate circuit 12 is inverted to change its logical state from "1" to "0". A load capacitance of the terminal from which the voltage Vi is derived is considerably larger than that of the terminal for the voltage Vout. The fall of the voltage Vout is sharper than the rise of the voltage Vi. Upon impression of the voltage Vout ("0" level), the transmission gate circuit TrN is nonconductive, so that the voltage Vi stops rising and at this instance falls according to the CxRx time constant of the CR circuit 10. As the voltage Vi falls below the low level threshold voltage $V_{IL}$ of the Schmidt gate circuit 12, the circuit 12 changes its logical state from "0" to "1". The rise, like the fall, is instantaneously produced. This operation repeats to produce a pulse signal at a predetermined frequency.

FIG. 2 shows another oscillation circuit made up of a p-channel MOS transistor as a transmission gate circuit TrP, a Schmidt gate circuit 16 operating in a positive-phase-sequence mode and a CR circuit 10. The gate circuit 16 produces inverted pulses of the pulses produced from the Schmidt gate circuit 12 shown in FIG. 1. The operation of this example is similar to that of the FIG. 1 circuit. No explanation of it will therefore be given.

FIG. 3 shows an actual arrangement of the oscillation circuit shown in FIG. 2. The IC circuit 14 uses a series connection of inverters 18, 20, 22, and 24 as the Schmidt gate circuit 12. A resistor R1 is inserted between the input terminal of the initial stage inverter 18 and the terminal for providing the voltage Vi from the CR circuit 10. Another resistor R2 is connected between the input terminal of the inverter 18 and the output terminal of the inverter 20. A divided volage Va produced according to a ratio of the resistances of the resistors R1 and R2 and a signal $\phi$ derived from the output terminal of the inverter 20 is applied to the input terminal of the initial stage inverter 18. The output signal $\phi$ produced from the inverter 20 is applied to the gate of the P-channel MOS transistor which allows the power $V_{DD}$ to be supplied to the CR circuit 10.

With such an oscillation circuit, it is assumed that the output signals from the inverters 18 and 20 are at "0" and "1" logic level, respectively. At the instant the voltages Vi and Va decrease and the voltage falls below the threshold voltage Vthl of the inverter 18, the output signals of the inverters 18 and 20 are inverted, as shown in FIG. 4B. At this instance, the voltage Vi has dropped to the low level threshold voltage $V_{IL}$, as shown in FIG. 4A. The following relationship holds between the low level threshold voltage $V_{IL}$ and the threshold volage Vthl of the inverter 18

$$V_{IL} = \frac{R1 + R2}{R2} \cdot Vthl - \frac{R1}{R2} \cdot V_{DD} \qquad (1)$$

wherein R1 and R2 are resistance of the resistors R1 and R2. The output signal $\phi$ of the inverter 20 is at the "0" level and the output signal Vout of the inverter 24 instantaneously changes its logical state from "1" to "0", so that the transmission gate circuit TrP is conductive. The gate circuit TrP allows the power $V_{DD}$ to pass to the CR circuit 10. Then the voltage Vi and Va starts to rise, as shown in FIGS. 4A and 4B. As the voltage Va reaches the threshold voltage Vthl of the inverter 18, as shown in FIG. 4B, the inverters 18 and 20 are inverted to change their output level from "1" to "0" and "0" to "1", respectively. The voltage Vi, at this time, has risen to the high level threshold voltage $V_{IH}$, as shown in FIG. 4A. The following relationship holds between the high level threshold voltage $V_{IH}$ and the threshold voltage Vthl of the inverter 18

$$V_{IH} = \frac{R1 + R2}{R2} \cdot Vthl \qquad (2)$$

The output signal Vout of the output stage inverter 24 changes instantaneously from "0" to "1" and the transmission gate circuit TrP becomes nonconductive. As a result, the gate circuit TrP stops the power supply to the CR circuit 10 and the voltage Vi starts to decrease. Such an operation repeats to generate the pulse signal Vout as shown in FIG. 4C from the output stage inverter 24.

Let us calculate the period T of the pulse signal Vout, or the periods T1 and T2 shown in FIG. 4C. The voltage Vi falls to the low level threshold voltage $V_{IL}$ and the output signals $\phi$ and Vout of the inverters 20 and 24 are inverted to the "0" level. At this time, the signal φ ("0" level) is transferred to the gate of the transmission gate circuit TrP which in turn is conductive, and the voltage Vi starts to rise. In this situation, an equivalent circuit, as shown in FIG. 6, is formed. More specifically, the switch SW is turned on corresponding to the inverting operation of the inverter 18. A current (i1+i2), in response to the power source voltage $V_{DD}$ flows into the capacitor Cx and resistor Rx of CR circuit 10, and through the resistors R1 and R2, through an on-state resistor Rs of the transmission gate circuit TrP. Under this condition, the voltage $V_{DD}$ is mathematically expressed $$V_{DD} = \{i1(t) + i2(t)\} \cdot Rs + \frac{1}{Cx} \int i1(t)dt + V_{IL} \quad (3)$$

$$= \{i1(t) + i2(t)\} \cdot Rs + Rf \cdot i2(t)$$

where $$Rf = \left(\frac{1}{Rx} + \frac{1}{R1 + R2}\right)^{-1} \quad (4)$$

in the equation the initial values are $$i1(0) + i2(0) = \frac{V_{DD} - V_{IL}}{Rs} \quad (5)$$

$$i2(0) = \frac{V_{IL}}{Rf}. \quad (6)$$

From the equations (3) to (6), we see that i2(t) is $$i2(t) = \frac{V_{DD}}{Rs + Rs} - \left(\frac{V_{DD}}{Rs + Rf} - \frac{V_{IL}}{Rf}\right) e^{-\frac{t}{\tau 1}} \quad (7)$$

where $$\tau 1 = Cx \cdot \frac{Rs \cdot Rf}{Rs + Rf}. \quad (8)$$

Since the voltage $V_{IH}$ is $$V_{IH} = Rf \cdot i2(T1) \quad (9)$$

then we readily see from the equations that the period T1 is $$T1 = \tau 1 \cdot \ln \frac{(Rf \cdot V_{DD})/(Rs + Rf) - V_{IL}}{(Rf \cdot V_{DD})/(Rs + Rf) - V_{IH}} \quad (10)$$

After the period T1, the voltage Vi rises to the high level threshold voltage $V_{IH}$ and the output signals φ and Vout of the inverters are at the "1" level. At this time the signal φ ("1" level) is transferred to the gate of the transmission gate circuit TrP which in turn is nonconductive. Then the voltage Vi starts to decrease. In this situation, an equivalent circuit as shown in FIG. 8 can be depicted. As shown, the switch SW is turned on the current (i3+i4) in response to the power source voltage $V_{DD}$ flows into the resistor Rx and the capacitor Cx of Cr circuit 10, through the resistors R1 and R2. When the current i3 flows into the resistor Rx and the current i4 flows into the capacitor Cx, the voltage $V_{DD}$ and the current (i3+i4) are expressed by the following equation:

$$V_{DD} = \{i3(t) + i4(t)\} \cdot (R1 + R2) + i3(t) \cdot Rx \quad (11)$$

$$i3(t) \cdot Rx = \frac{1}{Cx} \int i4(t)dt. \quad (12)$$

In the equations, the initial values are $$i3(0) + i4(0) = \frac{V_{DD} - V_{IH}}{R1 + R2} \quad (13)$$

$$i3(0) = \frac{V_{IH}}{Rx}. \quad (14)$$

Accordingly, from the equations i3(t) is given $$i3(t) = \frac{V_{DD}}{R1 + R2 + Rx} - \left(\frac{V_{DD}}{R1 + R2 + Rx} - \frac{V_{IH}}{Rx}\right) e^{-\frac{t}{\tau 2}} \quad (15)$$

where $$\tau 2 = Cx \cdot \frac{(R1 + R2) \cdot Rx}{R1 + R2 + Rx} = Cx \cdot Rf. \quad (16)$$

Since the voltage $V_{IL}$ is $$V_{IL} = Rx \cdot i3(T2) \quad (17)$$

we see from the equations (15) and (16) that the period T2

$$T2 = \tau 2 \cdot \ln \frac{V_{IH} - (Rx \cdot V_{DD})/(R1 + R2 + Rx)}{V_{IL} - (Rx \cdot V_{DD})/(R1 + R2 + Rx)}. \quad (18)$$

Therefore, we have the period T of the pulse signal Vout from the equations (10) and (18) and we have the frequency given by $$f = \frac{1}{T} = \frac{1}{T1 + T2}. \quad (19)$$

As seen from the above equations, the frequency f of the pulse signal depends on the power source voltage $V_{DD}$ and the voltages $V_{IH}$ and $V_{IL}$. Further, the voltages $V_{IH}$ and $V_{IL}$ are dependent on the threshold voltage Vthl of the inverter 18, as seen from the equations (1) and (2). Therefore, when the voltage Vthl is proportional to a change in the voltage $V_{DD}$, the frequency f is constant independent of the power source voltage $V_{DD}$. In fact, however, the threshold voltage Vthl of the inverter 18 is not proportional to the change in the voltage $V_{DD}$, since the on-state resistance of the P-channel or N-channel MOS transistor, making up the inverter, changes depending on the voltage $V_{DD}$. Accordingly the voltage $V_{IH}$ and $V_{IL}$ are not proportional to the change in the voltage $V_{DD}$. The resistors R1 and R2 are comprised of, for example, P-type diffusion resistors. For this reason, the resistors R1 and R2 tend to have a variation in the resistance values because of the nature of its manufacturing process. Further, since their resistances vary with voltages, the input impedance of the operational amplifier varies with a change in the voltage $V_{DD}$. As described above, the frequency f of the pulse signal generated by the prior oscillation circuit changes unstably with variation in the power supply voltage $V_{DD}$.

SUMMARY OF THE INVENTION

Accordingly, an object of the present invention is to provide an oscillation circuit for generating pulses with a stable frequency characteristic.

The object may be achieved by an oscillation circuit which comprises CR circuit means including a parallel connection of a capacitor and a resistor; transmission gate circuit means connected in series to the CR circuit means and across a power supply through the CR circuit means for feeding current from the power source to the CR circuit means when conductive; comparing circuit means connected at one of the input terminals to a junction between the CR circuit means and the transfer gate circuit means and coupled at the other with a reference voltage produced by dividing the supply voltage from the power supply, the comparing circuit means comparing a voltage on the junction with the reference voltage and positively feeding back the resulting output to the input of the comparing circuit means so as to perform a Schmidt operation and the resulting output also supplied to the gate of the gate circuit means so as to allow the oscillation circuit to continue oscillation.

As described above, the present invention has a comparing circuit for comparing a change in the voltage generated according to a time constant of the CR circuit means with a reference voltage formed by dividing a power supply voltage and generating a pulse signal. The reference voltage is proportional to the power supply voltage. The comparing circuit may generate pulse signals with a stable frequency characteristic against a variation in the power supply voltage. As will be described in some embodiments, the present invention may be able to reduce undesirable power dissipation by providing an additional means to stop the generation of the reference voltage during the time when the oscillation is suspended.

BRIEF DESCRIPTION OF THE DRAWINGS

By way of example and to make the description clearer, reference is made to the accompanying drawings, in which:

FIGS. 1 to 3 are circuit diagrams of prior oscillation circuits;

Figure 9:
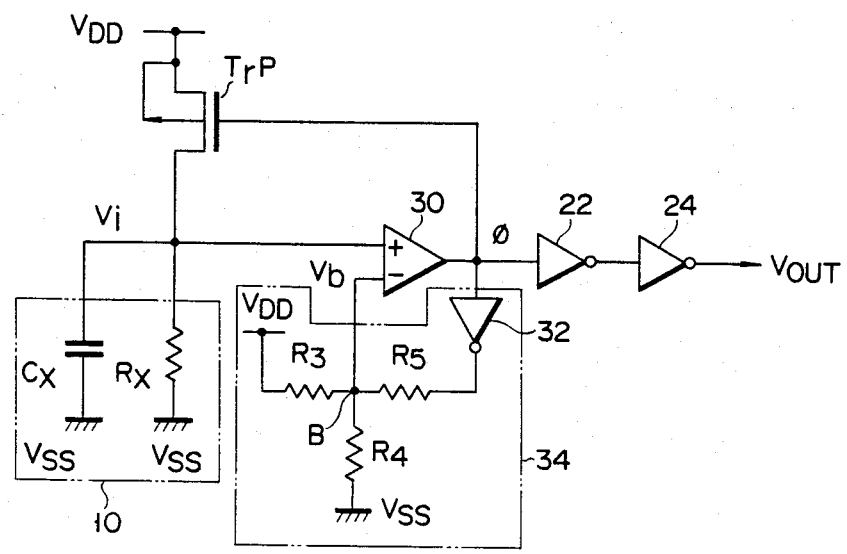
Figure 10:
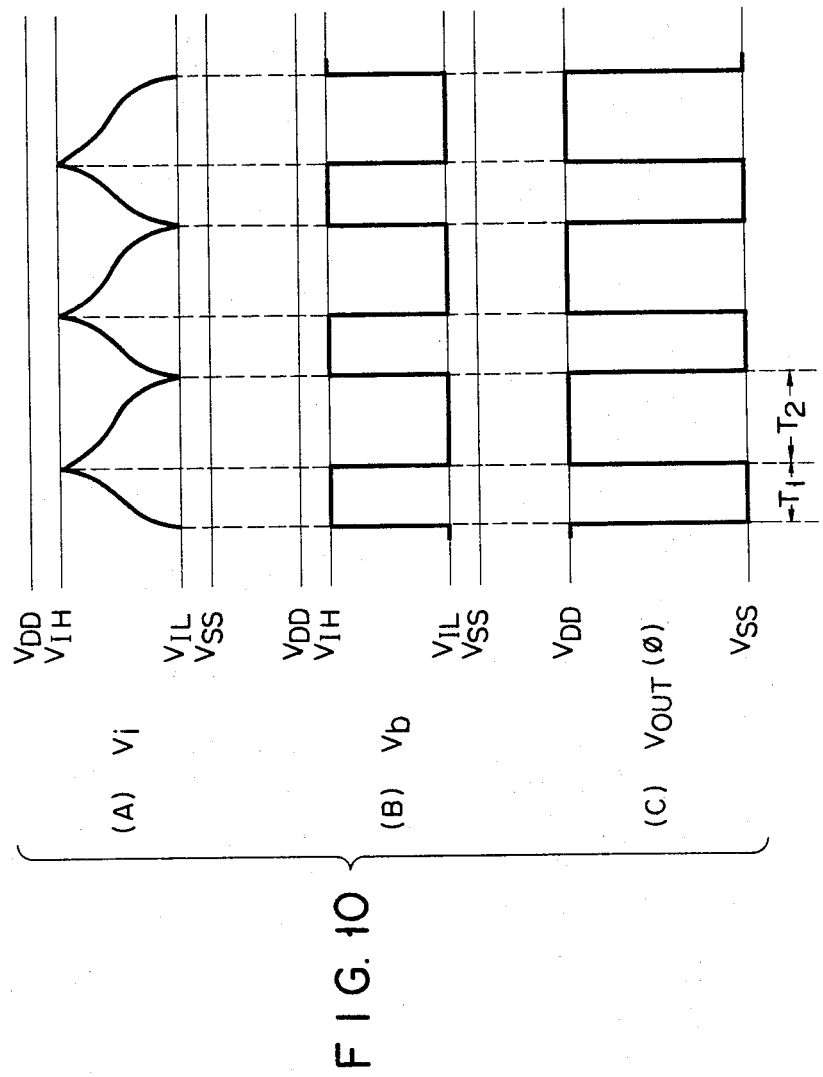
Figure 15:
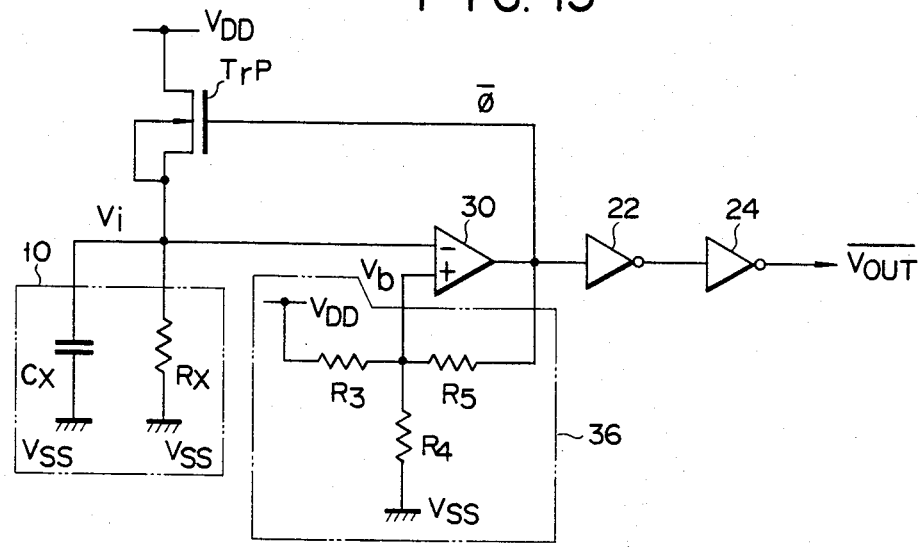
Figure 16:
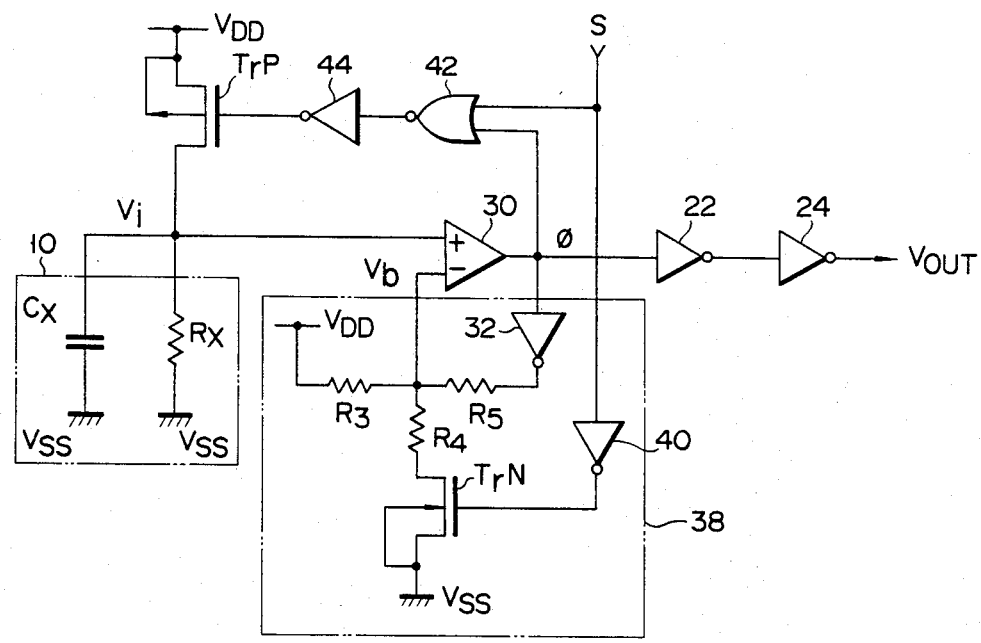
Figure 17:
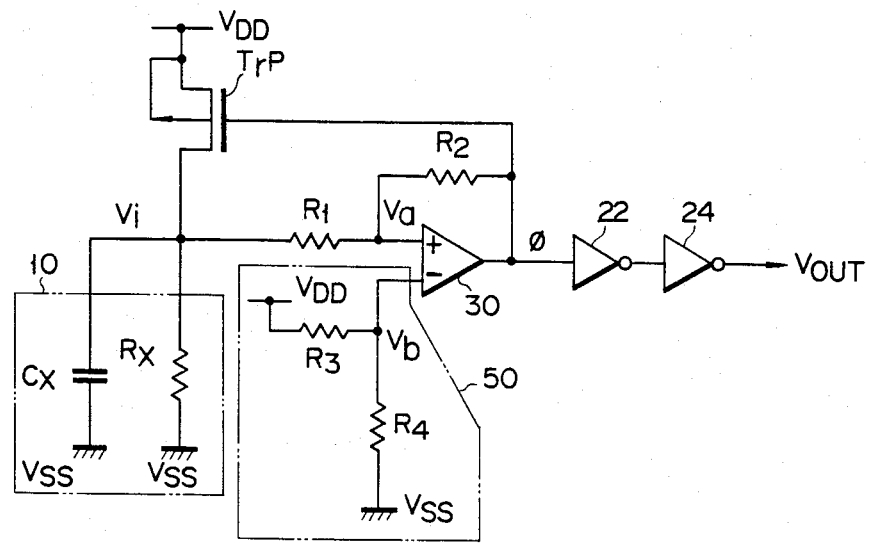
Figure 18:
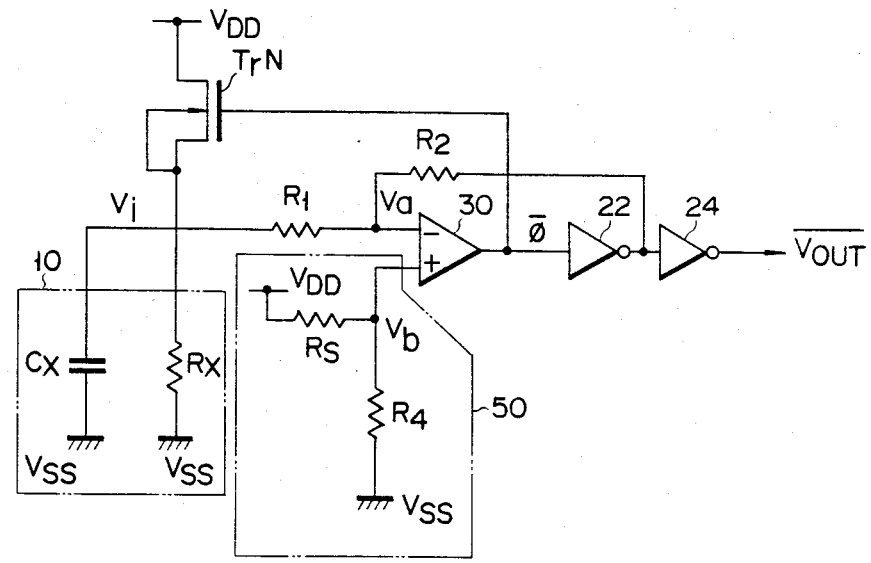

FIGS,. 5 to 8 show equivalent circuits for explaining the operation of the oscillation circuit shown in FIG. 3;

FIG. 9 shows a circuit diagram of a first embodiment of an oscillation circuit according to the present invention;

FIG. 10 shows waveform charts explaining the operation of the oscillation circuit shown in FIG. 9;

FIGS. 11 to 14 show equivalent circuits for explaining the operation of the oscillation circuit shown in FIG. 9;

FIG. 15 shows a circuit diagram of a second embodiment of an oscillation circuit according to the present invention;

FIG. 16 is a circuit diagram of a third embodiment of an oscillation circuit according to the present invention;

FIG. 17 is a circuit diagram of a fourth embodiment of an oscillation circuit according to the present invention;

FIG. 18 is a circuit diagram of a fifth embodiment of an oscillation circuit according to the present invention; and FIG. 19 is a circuit diagram of a sixth embodiment of an oscillation circuit according to the present invention.

DETAILED DESCRIPTION OF THE PREFERRED EMBODIMENTS

FIG. 9 shows a circuit diagram of a first embodiment of an oscillation circuit according to the present invention. In the figure, a comparing circuit 30 comprising an operational amplifier, for example, is used in place of the inverters 18 and 20. The operational amplifier circuit 30 used as the comparing circuit may be of a MOS transistor circuit type with a large input impedance, for example, as disclosed in U.S. Pat. No. 4,267,517 (Japanese Patent Application No. 108769/53). The operational amplifier circuit 30 is supplied at one ("+" side) of the input terminals with a voltage Vi generated at the terminal of the CR circuit 10 and at the other input terminal ("−" side) with a reference voltage Vb. The reference voltage Vb is a voltage generated at a junction (B) of resistors R3 and R4 connected in series across a power supply ($V_{DD}$-$V_{SS}$). An inverter 32 and a resistor R5 are connected in series between the junction B and the output terminal of the operational amplifier 30. Therefore, the reference voltage Vb is a divided voltage which varies with a dividing ratio determined by the resistors R3, R4 and R5 which changes according to a pulse signal $\phi$ from the output terminal of the operational amplifier circuit 30. The resistors R3 to R5 constitutes a variable reference voltage generating circuit 34. The pulse signal $\phi$ is supplied to the gate of the transmission gate circuit TrP comprising the P-channel MOS transistor. The remaining circuit arrangement is similar to that of the oscillation circuit shown in FIG. 3. Therefore, reference symbols are given to the like portions and no further explanation of it will be given.

It is assumed that, in such an oscillation circuit, the voltage Vi decreases to be at approximately "0" level. On this assumption, the output signal $\phi$ from the operational amplifier 20 is at "0" level and the output signal from the inverter 32 is at "1" level. The reference voltage Vb supplied, at this time, to the input terminal to the negative side of the operational amplifier circuit 30 is equal to a high threshold voltage $V_{IH}$ and is given by $$Vb = V_{IH} = \frac{R3R4 + R4R5}{R3R4 + R4R5 + R5R3} \cdot V_{DD}. \quad (20)$$

The signal $\phi$ ("0" level) is supplied to the gate of the transmission gate circuit TrP, so that the circuit TrP is conductive. Accordingly, the power supply voltage $V_{DD}$ is supplied to the CR circuit 10, so that the voltage Vi rises according to a time constant of the onstate resistance of the transistor TrP and the capacitance of the capacitor Cx. When the voltage Vi rises to approximately "1" level ($V_{TH}$), the output signal $\phi$ from the operational amplifier 30 becomes at "1" level and the output signal from the inverter 32 becomes at "0" level. The reference voltage Vb at this time is equal to the low level threshold voltage $V_{IL}$ and is given $$Vb = V_{IL} = \frac{R4R5}{R3R4 + R4R5 + R5R3} \cdot V_{DD}. \quad (21)$$

The signal $\phi$ ("1" level) is supplied to the gate of the transmission gate circuit TrP to render the circuit TrP nonconductive and to stop the supply of the power supply voltage $V_{DD}$ to the CR circuit 10. As a result, the voltage Vi decreases according to a time constant determined by Cx and Rx. The repetition of such operations causes pulses Vout, as shown in FIG. 10C, to be produced from the output terminal of the output stage inverter 24. A change in the reference voltage Vb is instantaneous, as shown in FIG. 10B, because the time constant determined by the resistors R3 to R5 is small.

Figure 11:
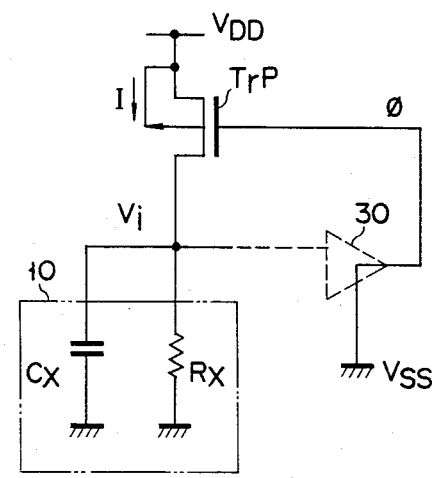
Figure 12:
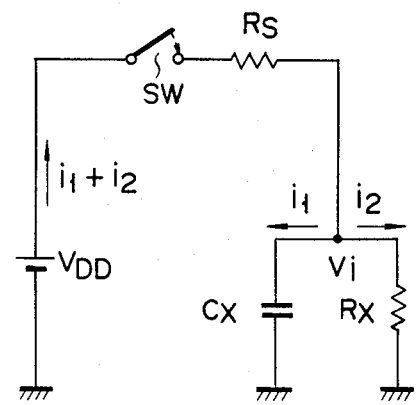

Let us calculate the period T of the pulse Vout oscillated through such an operation, i.e. the periods T1 and T2 shown in FIG. 10C. In a situation where the voltage Vi decreases to $V_{IL}$ and the signal $\phi$ becomes "0" level, as shown in FIG. 11, and the signal $\phi$ is supplied to the gate of the transmission gate circuit TrP, the equivalent circuit, as shown in FIG. 12, is formed. Since the transmission gate TrP is conductive, a current I(i1+i2) is supplied from the power supply ($V_{DD}$) to the capacitor Cx and the resistor Rx of the CR circuit 10, through the on-state switch SW and a resistor Rs. The resistor Rs is an on-state resistor of the MOS transistor constituting the transmission gate circuit TrP. The current I flows through the capacitor Cx and the resistor Rx in the form of i1 and i2. The power source voltage $V_{DD}$ is expressed as $$V_{DD} = \{i1(t) + i2(t)\} \cdot Rs + \frac{1}{Cx} \int i1(t)dt + V_{IL} \quad (22)$$

$$= \{i1(t) + i2(t)\} \cdot Rs + Rx \cdot i2(t).$$

In the equation, the initial values are $$i1(0) + i2(0) = \frac{V_{DD} - V_{IL}}{Rs} \quad (23)$$

$$i2(0) = \frac{V_{IL}}{Rx}. \quad (24)$$

From the above equations (22), (23) and (24), the current i2(t) is $$i2(t) = \frac{V_{DD}}{Rs + Rx} - \left(\frac{V_{DD}}{Rs + Rx} - \frac{V_{IL}}{Rx}\right) \cdot e^{-\frac{t}{\tau 1}} \quad (25)$$

where $$\tau 1 = Cx \cdot \frac{Rs \cdot Rx}{Rs + Rx}. \quad (26)$$

Further, the voltage $V_{TH}$ $$V_{IH} = Rx \cdot i2(T1) \quad (27).$$

Hence, from the equations (25) and (26) we see that the time period T1 is $$T1 = \tau 1 \cdot \ln \frac{(Rx/(Rs + Rx)) \cdot V_{DD} - V_{IL}}{(Rs/(Rs + Rx)) \cdot V_{DD} - V_{IH}} \quad (28)$$

Figure 13:
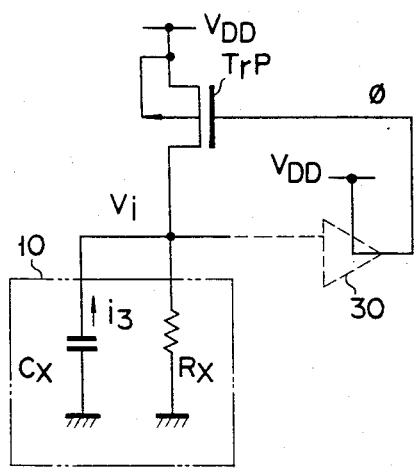
Figure 14:
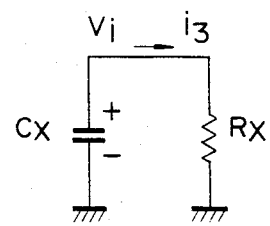

In a situation where the voltage Vi rises up to the voltage $V_{IH}$ after the period T1, and the signal $\phi$ becomes at "1" level, as shown, in FIG. 13, and the signal $\phi$ is supplied to the gate of the transmission gate circuit TrP, an equivalent circuit, as shown in FIG. 14, is formed. More explicitly, since the transmission gate circuit TrP becomes nonconductive, the power supply to the CR circuit 10 stops and the capacitor Cx is in a discharge mode, and the current i3 at that time flows into the resistor Rx. In this situation, the following formula holds.

$$0 = \frac{1}{Cx} \int i3(t)dt + Rx \cdot i3(t) \quad (29)$$

The initial value at this time is $$i3(0) = \frac{V_{IH}}{Rx} \quad (30)$$

Accordingly, from the equations (29) and (30), we see that i3(t) is $$i3(t) = \frac{V_{IH}}{Rx} \cdot e^{-\frac{t}{\tau 2}} \quad (31)$$

where $$\tau 2 = Cx \cdot Rx \quad (32).$$

Since the voltage $V_{IL}$ is $$V_{IL} = Rx \cdot i3(T2) \quad (33),$$

we know from the equations (32) and (33) that the period T2 is $$T2 = \tau 2 \cdot \ln \frac{V_{IH}}{V_{IL}}. \quad (34)$$

Arranging the equations (20), (21), (28) and (34), one has $$T1 = \tau 1 \cdot \ln \frac{Rx/(Rs + Rx) - R4R5/Ra}{Rx/(Rs + Rx) - (R3R4 + R4R5)/Ra}$$

$$= K1 \cdot \tau 1 \quad (35)$$

$$T2 = \tau 2 \cdot \ln \frac{R3 + R5}{R5} = K2 \cdot \tau 2 \quad (36)$$

where
Ra: R3R4+R4R5+R5R3
K1 and K2:constant.

Therefore, the period T of the pulse Vout is $$T = T1 + T2. \quad (37)$$

The frequency f of the pulse Vout $$f = \frac{1}{T} = \frac{1}{T1 + T2} = \frac{1}{K1 \cdot \tau 1 + K2 \cdot \tau 2} \quad (38)$$

The frequency f of the pulse Vout generated from the oscillation circuit is not dependent on the power supply voltage $V_{DD}$. As seen from the equations (20) and (21), the voltage $V_{IH}$ and $V_{IL}$ are proportional to the power supply voltage $V_{DD}$. Further, the input impedance at the positive input of the operational amplifier is large and hence, the operational amplifier circuit is stable against a change in the power supply voltage $V_{DD}$. Consequently, the oscillation circuit can oscillate the pulse signal Vout with a stable frequency characteristic against a change in the power supply voltage $V_{DD}$.

FIG. 15 shows a circuit diagram of an oscillation circuit of a second embodiment of the present invention. The oscillation circuit of the present embodiment employs a transmission gate circuit TrN comprised of an N-channel MOS transistor in place of the transmission gate circuit TrP comprised of the P-channel MOS transistor in the oscillation circuit shown in FIG. 9. The voltage Vi is supplied to the negative input terminal of the operational amplifier circuit 30 and the voltage Vb is supplied to the positive input terminal of the same. In the variable reference-voltage generating circuit 36 comprised of the resistors R3, R4 and R5 for generating the voltage Vb, one terminal is directly connected to the output terminal of the operational amplifier 30. While the oscillation circuit shown in FIG. 9 operates in a positive-phase mode the oscillation circuit of the second embodiment operates in a negative-phase mode. The output signal $\bar{\phi}$ produced from the operational amplifier 30 according to a change in the voltage Vi, and the output signal $\overline{Vout}$ of the inverter 24 are the inverted signals of the signals $\phi$ and Vout. The remaining arrangement, the operation and the effect of the present embodiment are the same as those of the first embodiment. No further explanation will be given.

FIG. 16 shows a circuit diagram of an oscillation circuit of a third embodiment of the present invention. The present embodiment additionally uses as oscillation stop function, compared with the oscillation circuit shown in FIG. 9. A variable reference-voltage generating circuit 38 for generating a reference voltage Vb supplied to the negative input terminal of the operational amplifier 30 is provided with a transmission gate circuit TrN comprised of an N-channel MOS transistor connected in series to the resistors R3 and R4 and across the power supply ($V_{DD}$ and $V_{SS}$) through the resistors R3 and R4. An oscillation stop signal S is supplied from a circuit (not shown) through an inverter 40 to the gate of the transmission gate circuit TrN. The signal S is supplied to one of the input terminals of NOR gate circuit 42 and the output signal $\phi$ from the operational amplifier circuit 30 is applied to the other input terminal of the same. The output signal from the NOR gate 42 is supplied through an inverter 44 to a transmission gate circuit TrP for controlling the supply of the power supply voltage $V_{DD}$ to the CR circuit 10. The remaining arrangement of the present embodiment is similar to that of the oscillation circuit shown in FIG. 9. The like symbols issued to designate the like portions in FIG. 9 and no explanation of it will be given.

With this arrangement of the oscillation circuit, when the voltage Vi is at logical "0" level, the output signal $\phi$ of the operational amplifier 30 is at "0" level and is supplied to the gate of the transmission gate TrP through the NOR gate circuit 42 and the inverter 44. At this time, the output signal of the inverter 32 is at logical "1" level and the reference voltage Vb reaches the high level threshold voltage $V_{IH}$, as given by the equation (20). Accordingly, the transmission gate circuit TrP is conductive to allow the supply of the power supply voltage $V_{DD}$ to the circuit 10. As a result, the voltage Vi starts to rise. When the voltage Vi rises to "1" level, the output signal $\phi$ of the operational amplifier 30 changes from "0" to "1" and is transferred to the gate of the transmission gate circuit TrP through the NOR gate circuit 42 and the inverter 44. At this time, the output signal from the inverter 32 is at "0" level and the reference voltage Vb is equal to the low level threshold voltage $V_{IL}$ as given by the equation (21). Accordingly, the transmission gate circuit TrP is nonconductive to stop the supply of the power supply voltage $V_{DD}$ to the CR circuit 10, and the voltage Vi drops. This operation repeats, so that the pulse Vout is produced from the inverter 24 at the output stage. In the oscillation circuit having such an oscillating operation, the oscillation stop signal S ("1" level) is supplied through the NOR gate circuit 42 and the inverter 44 to the gate of the transmission gate circuit TrP to render the circuit TrP nonconductive. Therefore, the supply of the power supply voltage $V_{DD}$ to the CR circuit 10 is stopped, irrespective of the output signal $\phi$ from the operational amplifier circuit 30, and the charge and discharge to and from the capacitor Cx are not performed, and oscillation stops. At this time, the oscillation stop signal S is supplied to the input terminal of the inverter 40. Upon receipt of the oscillation stop signal S, the inverter 40 supplies the output signal ("0" level) to the gate of the transmission gate circuit TrN, making the gate circuit TrN nonconductive. Accordingly, the generation of the reference voltage Vb stops, thereby preventing unnecessary power consumption. A logical state of the oscillation stop signal S is "0" level when the oscillation circuit is in a normal mode or in an oscillation mode.

The comparing circuit is not limited to the operational amplifier but may be any circuit if it has a comparing function.

FIG. 17 shows a circuit diagram of an oscillation circuit of a fourth embodiment of the present invention. In the present embodiment, a comparing circuit 30 comprised of an operational amplifier is used in place of the inverters 18 and 20 in the FIG. 3 circuit. A divided voltage Va produced according to a ratio of the resistors R1 and R2 connected in series and the output signal from the operational amplifier circuit 30 is supplied to the input terminal ("+" side) of the comparing circuit 30. The other input terminal ("−" side) of the comparing circuit 30 is supplied with a reference voltage Vb as a divided voltage produced according to a ratio of the resistances of the resistors R3 and R4 constituting a reference-voltage generating circuit 50 provided across the power supply ($V_{DD}$ - $V_{SS}$). The operation amplifier circuit 30 transfers from the output terminal to the gate of the transmission gate circuit TrP comprised of the P-channel MOS transistor. The remaining arrangement of the present embodiment is similar to that of the FIG. 3 embodiment.

Figure 4:
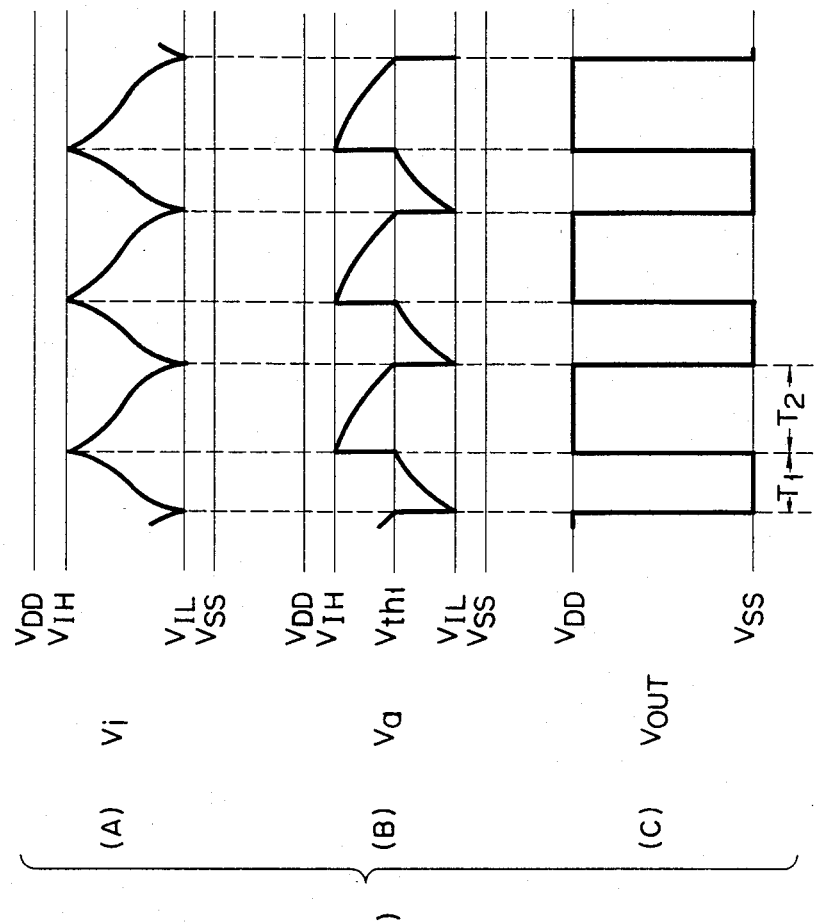
FIG. 4 shows waveform charts explaining the operation of the oscillation circuit shown in FIG. 3.
Figure 5:
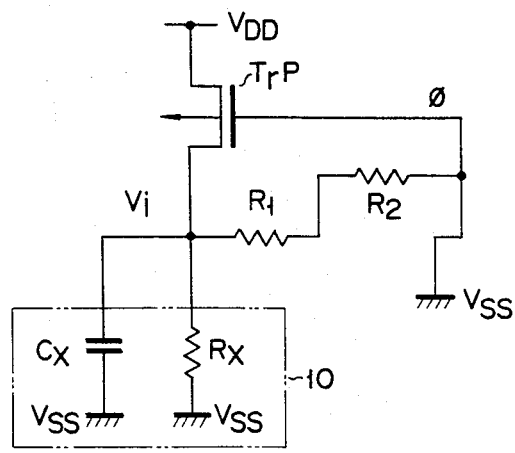
Figure 6:
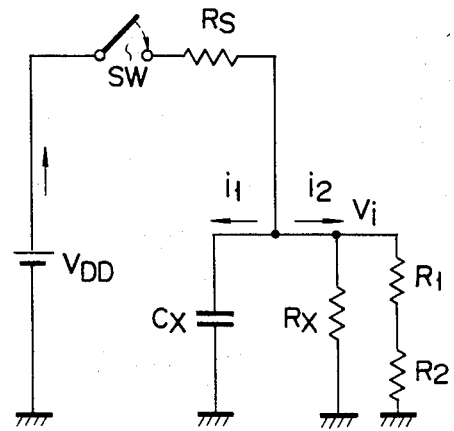

With such an arrangement, if the voltage Vi starts to decrease, the voltage Va at the positive input of the operational amplifier circuit decreases. When the voltage Vi, i.e. the voltage Va, decreases to the low level threshold voltage $V_{IL}$ of the operational amplifier circuit 30, the output signal $\phi$ becomes at "0" level. The oscillation circuit operates as illustrated in FIGS. 5 and 6 and the signal $\phi$ ("0" level) is supplied to the gate of the transmission gate circuit TrP and the gate circuit TrP is conductive. Accordingly, the power source voltage $V_{DD}$ is supplied to the CR circuit 10, so that the voltage Vi starts to rise. At this time, the low level threshold voltage $V_{IL}$ is expressed by $$V_{IL} = \frac{R1 + R2}{R2} \cdot Vb - \frac{R1}{R2} \cdot V_{DD} \quad (39)$$

$$= \left( \frac{R1 + R2}{R2} \cdot \frac{R4}{R3 + R4} - \frac{R1}{R2} \right) \cdot V_{DD}$$

Figure 7:
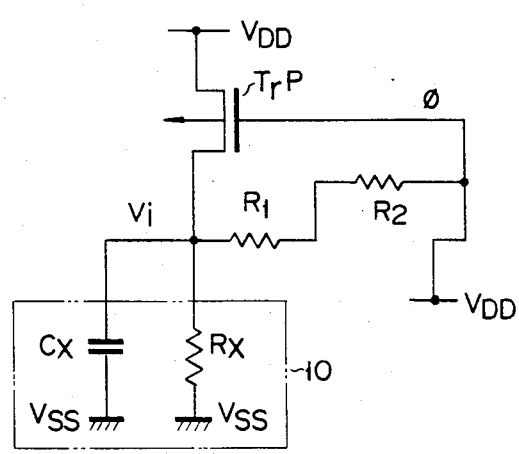
Figure 8:
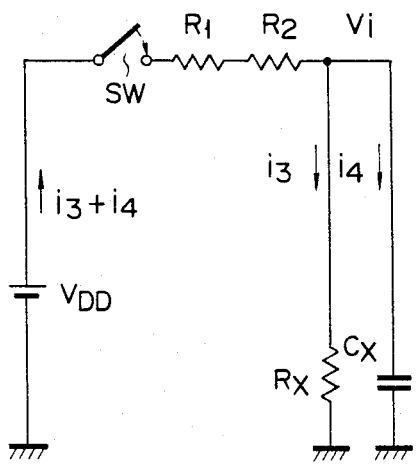

Further, when the voltage Vi, i.e. the voltage Va, rises to the high level threshold voltage $V_{IH}$ of the operational amplifier circuit 30, the output signal $\phi$ changes its logical state to "1". The circuit operation is performed as illustrated in FIGS. 7 and 8. With this operation, the signal φ ("1" level) is supplied to the gate of the transmission gate circuit TrP, so that the gate circuit TrP is nonconductive. Then, the supply of power supply voltage $V_{DD}$ to the CR circuit 10 is stopped and the voltage Vi starts to decrease. At this time, the high level threshold voltage $V_{IH}$ is given as $$V_{IH} = \frac{R1 + R2}{R2} \cdot Vb = \frac{R1 + R2}{R2} \cdot \frac{R4}{R3 + R4} \cdot V_{DD} \quad (40)$$

This operation repeats to produce the pulse Vout as shown in FIG. 10C from the inverter 24 of the output stage. The period T of the pulse Vout, or the periods T1 and T2 shown in FIG. 10C, arrived at from the equations (10) and (18), are given as $$T1 = \tau 1 \cdot \quad (41)$$

$$\ln \frac{(Rf/(Rs+Rf)) - ((R1+R2)/R2) \cdot (R4/(R3+R4)) + R1/R2}{(Rf/(Rs+Rf)) - ((R1+R2)/R2) \cdot (R4/(R3+R4))}$$

$$T2 = \tau 2 \cdot \quad (42)$$

$$\ln \frac{((R1+R2)/R2) \cdot (R4/(R3+R4)) - (Rx/(R1+R2+Rx))}{((R1+R2)/R2) \cdot (R4/(R3+R4)) - R1/R2 - (Rx/(R1+R2+Rx))}$$

To be more simple, the periods T1 and T2 are $$T1 = K1 \cdot \tau 1 \quad (43)$$

$$T2 = K2 \cdot \tau 2 \quad (44)$$

where K1 and K2 are constant. From the above equations (43) and (44), the frequency f of the pulse signal Vout is $$f = \frac{1}{T} = \frac{1}{T1 + T2} = \frac{1}{K1 \cdot \tau 1 + K2 \cdot \tau 2} \quad (45)$$

The equations (39) and (40) indicate that the threshold voltage $V_{IL}$ and $V_{IH}$ are proportional to the power supply voltage $V_{DD}$. Further, the equation (45) indicates that the frequency f is free from the power supply voltage $V_{DD}$ and hence is stable against variation in the power supply voltage $V_{DD}$.

FIG. 18 shows a fifth embodiment of an oscillation circuit according to the present invention. In the present embodiment, the transmission gate circuit TrP comprised of the P-channel MOS transistor in the FIG. 17 oscillation circuit is substituted by a transmission gate circuit TrN comprised of an N-channel MOS transistor. The operational amplifier 30 is supplied at the negative input terminal with the voltage Va and at the positive input terminal with the voltage Vb. While the oscillation circuit in FIG. 17 is of the positive-phase type, the FIG. 18 oscillation circuit is of the negative-phase type. Accordingly, the output signal φ of the operation amplifier circuit 30, produced in response to a change in the voltage Vi, and the output signal $\overline{Vout}$ of the inverter 24 are the inverted signal of the signal φ and the signal Vout, respectively. The remaining arrangement, the operation and the effect are the same as those of the FIG. 17 embodiment. An explanation of them will be omitted.

A sixth embodiment of an oscillation circuit according to the present invention shown in FIG. 19 is further provided with an oscillation stop function, compared to the FIG. 17 circuit. A reference-voltage generating circuit 52 for generating the reference voltage Vb supplied to the negative input terminal of the operational amplifier circuit 30 contain a transmission gate circuit TrN comprised of an N-channel MOS transistor connected in series with the resistors R3 and R4 across the power supply ($V_{DD}$ - $V_{SS}$). An oscillation stop signal S, supplied from a circuit (not shown), is supplied through an inverter 40 to the gate of the transmission gate circuit TrN. The signal S is supplied to one of the input terminals of the NOR gate circuit 42, while the output signal φ of the operational amplifier circuit 30 is supplied to the other input terminal. The output signal from the NOR gate circuit 42 is supplied to the gate of the transmission gate circuit TrP for controlling the supply of the power supply voltage $V_{DD}$ to the CR circuit 10 through the inverter 44. The remaining arrangement of this embodiment is the same as that of the FIG. 17 oscillator. No explanation will be given. The operation and the effects of the present embodiment are also similar to those of the FIG. 16 embodiment.

Although described using specific embodiments, the present invention may variously be modified and changed within the scope of the present invention.

What we claim is:

1. A transmission gate relaxation oscillator circuit comprising:
   first and second power source terminals;
   a capacitor and resistor (CR) circuit including a parallel connection of a capacitor and a resistor;
   transmission gate circuit means connected in series with said CR circuit between said first and second power source terminals, for controlling a current flowing through said CR circuit in response to a gate control signal;
   a reference voltage circuit connected between said first and second power source terminals to produce a reference voltage which is obtained by dividing a power source voltage between said first and second power source terminals at a predetermined ratio; and
   comparing circuit means including first and second resistors, and a comparing circuit having first and second input terminals and an output terminal, said first input terminal being connected to a first junction between said CR circuit and said transmission gate circuit means through said first resistor, said second input terminal being connected to receive said reference voltage from said reference voltage circuit, and said output terminal being connected to said first input terminal through said second resistor for comparing a voltage at said first junction with said reference voltage to form said gate control signal and feeding said gate control signal back to said first input terminal.

2. The oscillator circuit according to claim 1 wherein said reference voltage circuit comprises third and fourth resistors connected in series between said first and second power source terminals to supply the reference voltage from a second junction between said third and fourth resistors to said comparing circuit.

3. The oscillator circuit according to claim 1, wherein said reference voltage circuit comprises a transmission gate circuit having a gate, supplied at the gate with a signal to stop the oscillation, and third and fourth resistors connected in series with said transmission gate circuit between said first and second power source terminals to provide to said comparing circuit said reference voltage from the junction between said third and fourth resistors.

4. The oscillator circuit according to claim 1, wherein said comparing circuit is an operational amplifier circuit.

5. An oscillation circuit according to claim 1, further comprising oscillation damping means having a first input terminal coupled with said gate control signal from said comparing circuit means and a second input terminal coupled with a input signal for stopping the oscillation of said oscillation circuit, said oscillation damping means causing said transmission gate circuit means to stop said oscillations when said signal from said external circuit is at a predetermined level.

6. A transmission gate relaxation oscillator circuit comprising:
   first and second power source terminals which are respectively set at first and second voltage potential levels;
   a capacitor and resistor (CR) circuit including a parallel connection of a capacitor and a resistor;
   transmission gate circuit means connected through a first junction in series with said CR circuit between said first and second power source terminals to control a current flowing through said CR circuit in response to a gate control signal;
   a reference voltage circuit including first and second resistive means serially conntected through a second junction between said first and second power source terminals to produce a reference voltage at said second junction and third resistive means connected to said second junction for producing a reference voltage; and
   comparing circuit means having first and second input terminals and an output terminal, said first input terminal connected to said first junction, said second input terminal connected to said second junction, and said output terminal connected to said third resistive means and said transmission gate circuit means, said comparing circuit means responsive to a comparing of the reference voltage at the second junction and said voltage at the first junction, for producing a gate control signal to said transmission gate circuit means and an output signal of the first or second voltage potential level to said third resistive means, said reference voltage being proportional to the parallel combination of said second and third resistive means, divided by said first restive means plus the parallel combination of said second and third resistive means when the output of said comparing circuit means is at said first voltage potential level, and said reference voltage being proportional to said second resistive means divided by said second resistive means plus the parallel combination of said first and third resistive means when the output of said comparing circuit means is at the second voltage potential level.

7. The oscillator circuit according to claim 6, wherein said comparing circuit means includes an inverter and a comparing circuit having an output terminal directly connected to said transmission gate circuit means and to said third resistive means through said inverter.

8. The oscillator circuit according to claim 6, wherein said comparing circuit means includes a comparing circuit whose output terminal is connected to said transmission gate circuit means and to said third resistive means.

9. The oscillator circuit according to claim 7, wherein said first and second resistive means comprises first and second resistors connected in series between said first and second power source terminals to supply the reference voltage from said second junction to said comparing circuit.

10. The oscillator circuit according to claim 7, wherein said reference voltage circuit comprises a transmission gate circuit having a gate, supplied at the gate with a signal to stop the oscillation, said first and second resistive means connected in series with said transmission gate circuit between said first and second power source terminals to provide to said comparing circuit said reference voltage from said second junction between said first and second resistive means.

11. The oscillator circuit according to claim 7, wherein said comparing circuit is an operational amplifier circuit.

12. The oscillation circuit according to claim 7, further comprising oscillation damping means having a first input terminal coupled to receive said gate control signal from said comparing circuit means and a second input terminal coupled to receive an oscillation stop signal for stopping the oscillation of said oscillation circuit, said oscillation damping means responsive to a signal at a predetermined level for operating said transmission gate circuit means to stop said oscillations.

13. The oscillator circuit according to claim 8, wherein said first and second resistive means comprises first and second resistors connected in series between said first and second power source terminals to supply the reference voltage from said second junction to said comparing circuit.

14. The oscillator circuit according to claim 8, wherein said reference voltage circuit comprises a transmission gate circuit having a gate for receiving a signal to stop the oscillation, said first and second resistive means connected in series with said transmission gate circuit between said first and second power source terminals to provide to said comparing circuit said reference voltage from said second junction between said first and second resistive means.

15. The oscillator circuit according to claim 8, wherein said comparing circuit is an operational amplifier circuit.

16. The oscillation circuit according to claim 8, further comprising oscillation damping means having a first input terminal coupled to receive said gate control signal from said comparing circuit means and a second input terminal coupled to receive an oscillation stop signal for stopping the oscillation of said oscillation circuit, said oscillation damping means responsive to cause said transmission gate circuit means to stop said oscillations when said signal from said external circuit is at a predetermined level.

17. A transmission gate relaxation oscillator circuit comprising:
   first and second power source terminals which are respectively set at first and second voltage potential levels;
   a capacitor and resistor (CR) circuit including a parallel connection of a capacitor and resistor;
   transmission gate circuit means connected through a first junction in series with said CR circuit between said first and second power source terminals to control a current flowing through said CR circuit in response to a gate control signal;

a reference voltage circuit having first and second resistive means serially connected through a second junction and between said first and second power source terminals, and a third resistive means connected to said second junction for producing a reference potential on said second junction; and comparing circuit means having a first input connected to said first junction, a second input connected to said second junction, and an output connected to said transmission gate circuit means and said third resistive means;

said comparing circuit means responsive to an initial potential difference between said first and second junctions for producing an output which (1) applies a gate control signal to said transmission gate circuit means to change the voltage potential level at said first junction and (2) connects said third resistive means in parallel with said second resistive means to change the reference voltage at said second junction, said comparing circuit means responsive to the changes in potential at said first and second junctions for producing an output which (1) applies a gate control signal to said transmission gate circuit to change the voltage level at said first junction and (2) connects said third resistive means in parallel with said first resistive means to change the reference potential at said second junction and restore said initial potential difference between said first and second junctions.

* * * * *